(12) United States Patent
Kono

(10) Patent No.: US 8,294,874 B2
(45) Date of Patent: Oct. 23, 2012

(54) EXPOSURE APPARATUS

(75) Inventor: Michio Kono, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 397 days.

(21) Appl. No.: 12/370,959

(22) Filed: Feb. 13, 2009

(65) Prior Publication Data

US 2009/0213348 A1    Aug. 27, 2009

(30) Foreign Application Priority Data

Feb. 15, 2008 (JP) .................. 2008-035040
Dec. 17, 2008 (JP) .................. 2008-320382

(51) Int. Cl.
*G03B 27/44* (2006.01)
(52) U.S. Cl. ............... 355/46; 355/51; 355/66; 355/70
(58) Field of Classification Search .......... 355/46, 355/50, 51, 53, 66, 67, 70, 77
See application file for complete search history.

(56) References Cited

U.S. PATENT DOCUMENTS

| | | | | |
|---|---|---|---|---|
| 4,372,670 A | * | 2/1983 | Carpenter et al. | 399/211 |
| 4,457,616 A | * | 7/1984 | Tokuhara | 399/201 |
| 5,614,988 A | * | 3/1997 | Kato et al. | 355/46 |
| 5,959,784 A | * | 9/1999 | Seki et al. | 359/663 |
| 6,811,953 B2 | * | 11/2004 | Hatada et al. | 430/311 |
| 6,853,441 B2 | * | 2/2005 | Kobayashi et al. | 355/55 |
| 7,446,857 B2 | * | 11/2008 | Sandstrom | 355/67 |
| 2004/0105085 A1 | * | 6/2004 | Suzuki | 355/69 |
| 2006/0215133 A1 | * | 9/2006 | Hazelton | 355/52 |
| 2008/0013061 A1 | | 1/2008 | Kato | |
| 2008/0165333 A1 | * | 7/2008 | Kumazawa et al. | 355/53 |
| 2009/0009735 A1 | * | 1/2009 | Kato | 355/46 |
| 2009/0213348 A1 | * | 8/2009 | Kono | 355/66 |

FOREIGN PATENT DOCUMENTS

| | | |
|---|---|---|
| EP | 926556 | 6/1999 |
| JP | 11-265848 | 9/1999 |
| JP | 2004-093953 | 3/2004 |
| JP | 2007-249169 | 9/2007 |
| JP | 2007-286580 | 11/2007 |

* cited by examiner

*Primary Examiner* — Thomas R Artman
(74) *Attorney, Agent, or Firm* — Canon U.S.A., Inc., IP Division

(57) ABSTRACT

A scanning exposure apparatus has plural projection optical systems having plural mirrors configured to form an optical-axis shift vector. Its component in a direction orthogonal to a scanning direction is set so that adjacent areas in plural areas on the original can adjoin each other when viewed from the direction orthogonal to the scanning direction and adjacent areas in plural areas on the substrate can adjoin each other when viewed from the direction. A size of its component in the scanning direction is set so that a product between the imaging magnification of each projection optical system and a distance between centers of two areas on the original in the scanning direction corresponding to two projection optical systems in the plurality of projection optical systems can be equal to a distance between centers of two areas on the substrate corresponding to the two projection optical systems in the scanning direction.

14 Claims, 6 Drawing Sheets

EXPOSURE APPARATUS

BACKGROUND OF THE INVENTION

1. Field of the Invention

The present invention relates to an exposure apparatus.

2. Description of the Related Art

Conventionally, a known exposure apparatus synchronously scans the original and the substrate and exposes a plurality of areas (screens) on the original onto a substrate (plate) at an equal magnification via a plurality of different projection optical systems (Japanese Patent Application No. 2004-093953). An inexpensive exposure of a large liquid crystal panel with good yield has recently been increasingly required to inexpensively supply a large amount of widescreen liquid crystal displays. The conventional equal-magnification projection optical system may require a large original to expose a large liquid crystal panel, and thus a precise manufacture of the large liquid crystal panel would cause a cost increase. Japanese Patent Laid-Open No. 11-265848, 2007-286580, and 2007-249169 propose use of a projection optical system having an enlargement magnification to reduce a size of the original.

However, according to Japanese Patent Laid-Open No. 11-265848, 2007-286580, and 2007-249169, an optical axis of each projection optical system at the original side coincides with its optical axis at the substrate side. In other words, since the point at which the optical axis of each projection optical system at the original side is projected onto the substrate accords with the point at which the optical axis at the substrate side is projected onto the substrate, the projection optical system is likely to physically interfere unless respective areas on the original are greatly separated. As a result, the original is still large, and there is room for a miniaturization. It is also important to connect screens on the substrate.

SUMMARY OF THE INVENTION

According to one aspect of the invention, an exposure apparatus is provided that is configured to expose a plurality of areas on an original onto a substrate by synchronously scanning the original and the substrate. The exposure apparatus includes a plurality of projection optical systems each having an imaging magnification of an equal enlargement or reduction, and each projection optical system forming an intermediate image of the pattern of the original and projecting an erect image of the pattern of the original onto the substrate. Each projection optical system includes a plurality of mirrors configured to form an optical-axis shift vector that has a start point that is a point on the substrate at which an optical axis of the projection optical system on an original side intersects with the substrate, and an end point that is a point on the substrate at which an optical axis of the projection optical system on a substrate side intersects with the substrate, and a movement unit configured to move the plurality of mirrors so that the optical-axis shift vector has a component in a direction orthogonal to a scanning direction which enables adjacent areas in the plurality of areas on the original to adjoin each other when viewed from the direction orthogonal to the scanning direction and enables adjacent areas in the plurality of areas on the substrate to adjoin each other when viewed from the direction orthogonal to the scanning direction, and configured to move the plurality of mirrors so that the optical-axis shift vector has a component in a scanning direction which enables a product between the imaging magnification of each projection optical system and a distance between centers of two areas on the original in the scanning direction corresponding to two adjacent projection optical systems in the plurality of projection optical systems to be equal to a distance between centers of two areas on the substrate in the scanning direction corresponding to the two adjacent projection optical systems.

According to another aspect of the invention, a projection optical system is provided that is configured to form an intermediate image of a pattern of an original, and to project an erect image of the pattern of the original onto a substrate. The projection optical system includes a pair of mirrors configured to generate an optical-axis shift vector that has a start point that is a point on a substrate, at which an optical axis of the projection optical system on an original side intersects with the substrate, and an end point that is a point on the substrate, at which an optical axis of the projection optical system on a substrate side intersects with the substrate, and a movement unit configured to move the mirrors in a direction perpendicular to the optical axis of the projection optical system on the substrate side.

Further features of the present invention will become apparent from the following description of exemplary embodiments with reference to the attached drawings.

DESCRIPTION OF THE EMBODIMENTS

Figure 1:
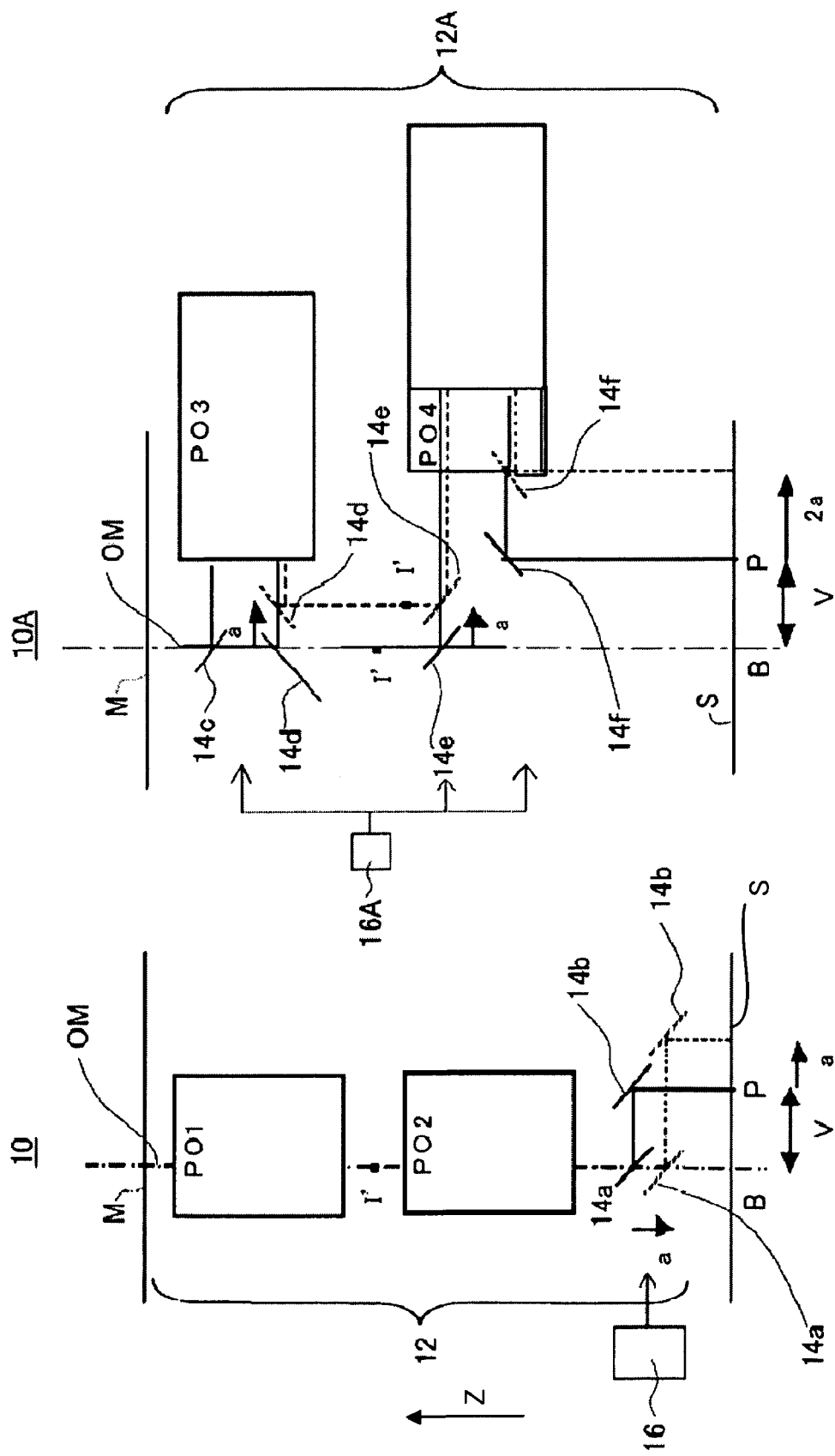
FIG. 1A is a block diagram of an exposure apparatus according to one aspect of the present invention and FIG. 1B is a block diagram of a variation of the exposure apparatus shown FIG. 1A.

Referring now to the accompanying drawings, a description will be given of an exposure apparatus according to one aspect of the present invention. FIG. 1A is a block diagram of an exposure apparatus 10, and FIG. 1B is a block diagram of an exposure apparatus 10A that is a variation of the exposure apparatus 10. The exposure apparatuses 10 and 10A are scanning exposure apparatuses which include illumination apparatuses (not shown) and projection optical systems 12 and 12A, and are configured to synchronously scan an original M and a substrate S, and to expose each of a plurality of areas on the original M onto the substrate S through a different projection optical system.

The illumination apparatus includes a light source (not shown), such as a laser and a mercury lamp, and an illumination optical system (not shown), and uniformly illuminates the original M. In order to synchronously scan the original M and the substrate S, there are an original stage (not shown) configured to support and drive the original M, and a substrate stage (not shown) configured to support and drive the substrate S. The original M and the substrate S are arranged parallel to each other.

The exposure apparatus 10 provides a plurality of projection optical systems 12 for the areas of the original M. Similarly, the exposure apparatus 10A provides a plurality of projection optical systems 12A for the areas of the original M.

Each projection optical system 12 has the same imaging magnification, which is an enlargement magnification in this embodiment. Similarly, each projection optical system 12A has the same imaging magnification, which is an enlargement magnification in this embodiment.

Each projection optical system 12 has a pair of imaging optical system PO1 and PO2. Each projection optical system 12 forms an intermediate image I' of a pattern of the original M, and projects an erect image of the pattern of the original M onto the substrate S. An intermediate imaging surface in which the intermediate image I' is formed sits between the pair of imaging optical systems PO1 and PO2. As long as the imaging magnification of the projection optical system 12 is an enlargement magnification as a whole, the imaging magnification of each of the pair of imaging optical systems PO1 and PO2 may be an enlargement magnification, an equal magnification, or a reduction magnification.

The projection optical system 12A has a pair of imaging optical system PO3 and PO4. Each projection optical system 12A forms an intermediate image I' of a pattern of the original M, and projects an erect image of the pattern of the original M onto the substrate S. The intermediate imaging surface in which the intermediate image I' is formed sits between the pair of imaging optical systems PO3 and PO4. As long as the imaging magnification of the projection optical system 12A is an enlargement magnification as a whole, the imaging magnification of each of the pair of imaging optical systems PO3 and PO4 may be an enlargement magnification, an equal magnification, or a reduction magnification.

The imaging optical systems PO1 and PO2 are coaxial to the optical axis OM of the projection optical system on the original side. On the other hand, the imaging optical systems PO3 and PO4 have optical axes that are made by deflecting the optical axis OM by 90°.

The projection optical system 12 includes a pair of plane (or deflection) mirrors 14a and 14b configured to form an optical-axis shift vector V that has as a start point a point B at which the optical axis OM on the original side (for each area) intersects with the substrate, and has as an end point a point P at which an optical axis OP of the projection optical system 12 on the substrate side (for the corresponding transfer area) intersects with the substrate S. The pair of plane mirrors 14a and 14b are arranged between the substrate S and the imaging optical system PO2 that is closest to the substrate S, as shown in FIG. 1A. The plane mirror 14a deflects an optical path of a luminous flux emitted from the imaging optical system PO2, by 90° in a direction orthogonal to the optical axis OM on the original side (or in the horizontal direction in FIG. 1A), and the plane mirror 14b then deflects the luminous flux reflected on the plane mirror 14a by 90° and perpendicularly irradiates it onto the substrate S. In FIG. 1A, the plane mirrors 14a and 14b are configured to move in a Z direction or the optical-axis direction, and the plane mirror 14b is configured to move also in the horizontal direction. Thereby, a size of the optical-axis shift vector V is adjustable by a length "a," and it is easy to correct the aberration without substantially modifying an optical design value of each imaging optical system. 16 denotes a movement unit configured to move the plane mirrors 14a and 14b.

The projection optical system 12A includes plane mirrors 14c to 14f. As shown in FIG. 1B, the plane mirror 14c is arranged between the original M and the imaging optical system PO3 that is closest to the original M; the plane mirrors 14d and 14e are arranged between the adjacent imaging optical systems PO3 and PO4. The plane mirror 14f is arranged between the substrate S and the imaging optical system PO4 that is closest to the substrate S. The plane mirror 14c deflects the optical path of the diffracted light from the original M by 90° in the direction orthogonal to the optical axis OM on the original side (or in the horizontal direction in FIG. 1B), and leads the luminous flux to the imaging optical system PO3; the plane mirror 14d deflects the light emitted from the imaging optical system PO3 by 90°. Next, the plane mirror 14e deflects a luminous flux from the plane mirror 14d by 90°, and leads the luminous flux to the imaging optical system PO4; the plane mirror 14f deflects the luminous flux emitted from the imaging optical system PO4 by 90°, and perpendicularly irradiates the light onto the substrate S. Thus, the projection optical system 12A includes a pair of plane (or deflection) mirrors 14c and 14f configured to form an optical-axis shift vector V that has as a start point a point B at which the optical axis OM of the projection optical system 12A on the original side intersects with the substrate S, and has as an end point a point P at which the optical axis OP of the projection optical system 12A on the substrate side intersects with the substrate S. The pair of plane mirrors 14c and 14f are arranged before and after the intermediate image I', as shown in FIG. 1B. Thus, the exposure apparatuses 10 and 10A each generate the optical-axis shift vector V, because the optical axis OM on the original side shifts from the optical axis OP on the substrate side. Shift correction of the optical-axis shift vector V enables the plurality of areas on the original M to be closely arranged, and achieves a miniaturization of the original M and the cost reduction. In FIG. 1B, the plane mirrors 14d and 14e are configured to move in the horizontal direction, and the plane mirror 14f is configured to move also in the horizontal direction. As shown in FIG. 1B, the imaging optical system PO4 provided closer to the substrate than the original is configured to move in the horizontal direction by a movement unit. When the plane mirrors 14d and 14e move by a length "a" in the horizontal direction, a size of the optical-axis shift vector V can be adjusted by the length "2a," and the aberration can easily be corrected without substantially modifying an optical design value of each imaging optical system. 16A denotes a movement unit configured to move the plane mirrors 14d to 14f.

Thus, a plurality of projection optical systems that have the same arrangement of the imaging optical systems can connect images of the plurality of projection optical systems by adjusting the arrangement of the plane mirrors of each projection optical system.

A size of a component of the optical-axis shift vector V in the direction orthogonal to the scanning direction is set so that adjacent areas in a plurality of areas on the original M adjoin each other when viewed from direction orthogonal to the scanning direction and adjacent areas in a plurality of areas on the substrate S adjoin each other when viewed from the direction orthogonal to the scanning direction. In addition, a size of the component of the optical-axis shift vector V in the scanning direction is set so that a product between the imaging magnification of each projection optical system and a distance in the scanning direction between centers of two areas on the original corresponding to two adjacent projection optical systems in the plurality of projection optical systems can be equal to a distance in the scanning direction between centers of two areas on the substrate corresponding to the two adjacent projection optical systems. This will be described in detail later with reference to FIG. 2 or subsequent figures.

Figure 2:
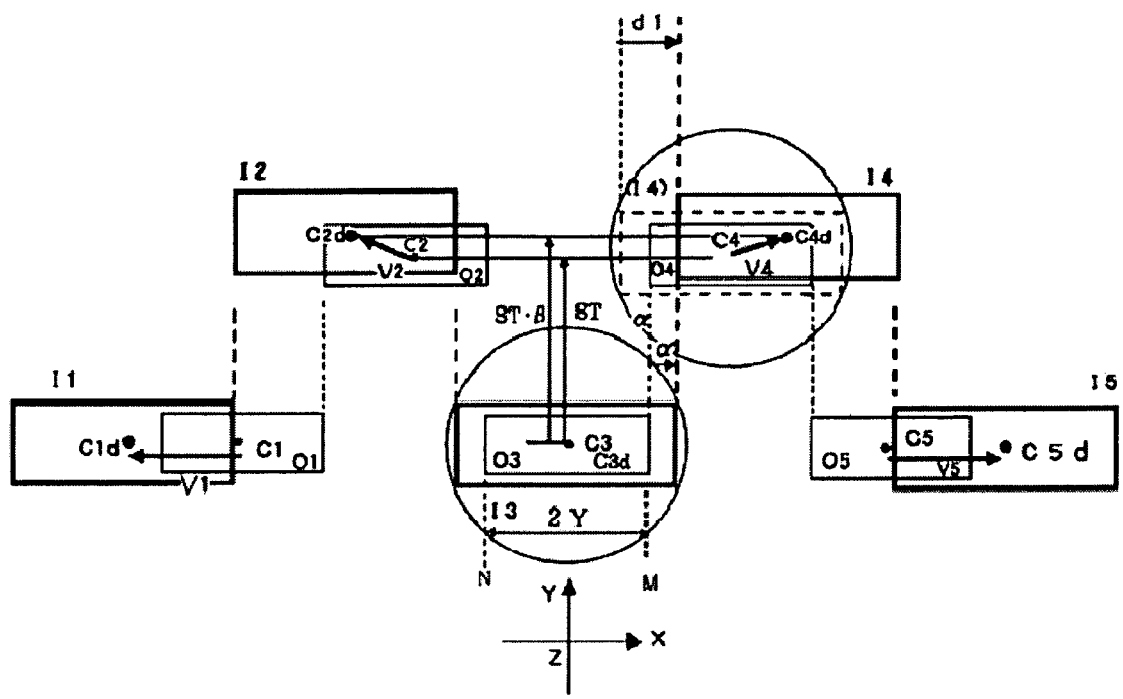
FIG. 2 is a plane view showing an example of a relationship between a plurality of areas (screens) on a mask (original) and a plurality of transfer areas of a plate (substrate).

FIG. 2 is a plane view showing an example of a relationship between a plurality of areas (screens) on a mask (original) and a plurality of transfer areas on a plate (substrate). FIG. 2 is a plane view of the mask viewed from the top when a patterned area on the mask is divided into five parts to be enlarged and projected on the plate. In FIG. 2, C1 to C5 denote centers of the divided screens on the mask, and O1 to O5 denote divided screens. Thick line areas I1, I2, I3, I4, and I5 around or near the respective divided screens denote screens (image surfaces) on the plate, and circles denote outlines of corresponding projection optical systems. The imaging magnification of the projection optical system β is an enlargement magnification in this embodiment and its value is not particularly limited, but an effective arrangement may be available in a range of $1<\beta<2.5$. In addition, each projection optical system may have the same screen size.

Figure 3:
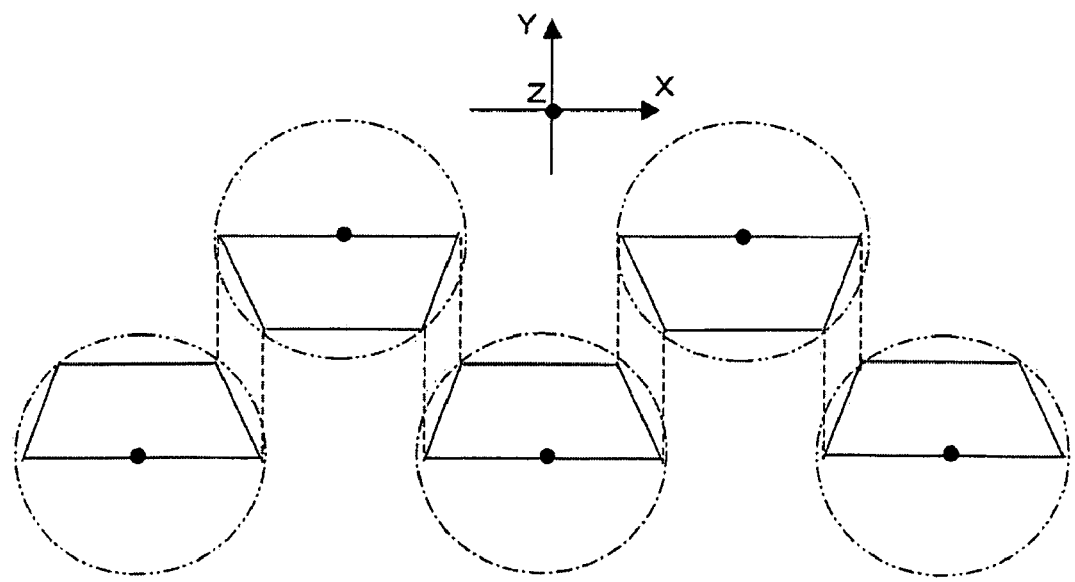
FIG. 3 is an example of a variation of a shape of the original shown in FIG. 2.

In certain cases, a joint between adjacent screens may be an indispensable requirement. In order to avoid the physical interference between the projection optical systems, the divided screens O1 to O5 may shift in the scanning direction (or in the Y direction) by a predetermined amount ST and form a houndstooth check, but they may also contact each other when viewed from the (X) direction orthogonal to the scanning direction. For example, the divided screens O2 to O4 contact the lines M and N. The respective divided screens O1 to O5 each have a rectangular shape, but they may also have a trapezoidal shape, as shown in FIG. 3. In FIG. 3, each trapezoid corresponds to a screen on the substrate, and an alternate long and two short dashes line denotes an outline of the projection optical system. Thus, a first condition may be that the screens are jointed in the direction orthogonal to the scanning direction on the mask surface. The "screens are jointed" means the adjacent screens adjoin each other via a predetermined shift amount.

In addition, if the center of the screen I4 is set to the center C4 of the divided screen O4 in an enlargement system, similar to the equal magnification system, the center of the screen I4 becomes as shown by a dotted line in FIG. 2 and the screens I3 and I4 on the plate surface partially overlap. The overlap amount $2\alpha$ is given by $2Y \cdot (\beta-1)$, where Y is half a length of each area (each divided screen) on the mask in the direction orthogonal to the scanning direction.

In order to avoid the overlap between the adjacent screens, the center C4 of the divided screen O4 of the mask may be fixed and the center C4d of the plate screen may need to be shifted in the X direction by d1 ($=2\alpha$). In FIG. 2, this moving amount is shown by the vector V4. As a result, the screen I4 on the plate is set to a position shown by a solid line. For the same reason, the screen I2 on the plate may be shifted from the center of the divided screen O2 in the reverse direction by d1 to a position shown by the solid line, and the center may be set to the C2d. In FIG. 2, V2 denotes a moving amount between the screens C2 and C2d. In other words, each projection optical system has an optical-axis shift vector (such as vectors V2 and V4) made by connecting two points corresponding to the optical axis on the mask side and the optical axis on the plate side which are projected on the plate.

The projection optical system for the screen O1 and the projection optical system for the screen O5 are farther from a scanning center axis (Y axis) than the projection optical system for the screen O2 and the projection optical system for the screen O4 are. The scanning center axis is an axis that is parallel to the scanning direction (or the Y direction), and that passes the center (the center of the projection optical system for the screen O3 in FIG. 2) of a plurality of projection optical systems in the (X) direction orthogonal to the scanning direction. "d1" is added to shift amounts (|V1|, |V5|) of the projection optical system for the screen O1 and the projection optical system for the screen O5 and become larger. Assume that n is a natural number, and odd ($=2n+1$) projection optical systems are arranged symmetrical with respect to the scanning center axis. Then, $2n \cdot Y(\beta-1)$ is a size of the component of the optical-axis shift vector in the direction orthogonal to the scanning direction of the n-th projection optical system from the central projection optical system (i.e., the projection optical system for the screen O3 in FIG. 2) among the plurality of projection optical systems in the direction orthogonal to the scanning direction.

For instance, both the projection optical system for the screen O2 and the projection optical system for the screen O4 are first projection optical system from the projection optical system for the screen O3, and the shift amount is $2Y(\beta-1)$. Both the projection optical system for the screen O1 and the projection optical system for the screen O5 are second projection optical system from the projection optical system for the screen O3, and the shift amount is $4Y(\beta-1)$. The n-th projection optical system, even though it is located on the right side or on the left side, is considered positive. For example, both the projection optical system for the screen O2 and the projection optical system for the screen O4 are first projection optical system from the projection optical system for the screen O3 rather than $+1^{st}$ and $-1^{st}$ projection optical systems. This condition enables a plurality of projection optical systems having the enlargement magnification to relatively precisely joint mask's wide screens on the plate for the overall exposure.

The shift amount ST of the projection optical system in the scanning direction may be necessary to avoid the physical interference between adjacent optical systems, but a small shift amount may be advantageous to reduce the overall scanning time and to increase the number of plates to be processed. In addition, a shift itself of the projection optical systems by ST may not negatively affect a joint of optical images. Rather, this may merely cause time deviations among the projection optical systems by each of which an exposure of each area on the mask pattern differs in the scanning exposure, and the images are geometrically jointed once the plate is entirely exposed.

Each projection optical system has the same enlargement imaging magnification, and includes a pair of plane mirrors configured to generate an optical-axis shift vector having a start point that is a point at which its optical axis on the original side intersects with the substrate, and an end point that is a point at which its optical axis on the substrate side intersects with the substrate. The size of the component of the optical-axis shift vector in the direction orthogonal to the scanning direction may need to be set so that adjacent areas of a plurality of areas on the original can adjoin each other in the direction orthogonal to the scanning direction (first condition). In addition, the size of the component of the optical-axis shift vector in the direction orthogonal to the scanning direction may need to be set so that the adjacent areas in a plurality of areas on the substrate adjoin each other in the direction orthogonal to the scanning direction (second condition).

Moreover, the size of the optical-axis shift vector in the scanning direction of two adjacent projection optical systems in the plurality of projection optical systems may be set so that a product between the imaging magnification of each projection optical system and a distance between centers of two corresponding areas on the original in the scanning direction corresponding to the two adjacent projection optical systems is equal to a distance between centers of two corresponding areas on the substrate in the scanning direction corresponding to the two adjacent projection optical systems. The reason for this condition may be understood from the fact that a distance between two arbitrary points on mask is enlarged by the magnification on the plate in the scanning direction so as to form a finally enlarged transfer image on the plate. For example, the product between the enlargement magnification β and the distance ST between the center C3 of the screen O3 and the center C4 of the screen O4 in the scanning direction is equal to a distance ST·β in the scanning direction between the center C3d of the corresponding screen I3 and the center C4d of the corresponding screen I4 in the scanning direction (third condition).

The movement unit moves the plane mirrors and the imaging optical systems etc. so as to satisfy the first condition to the third condition. While the first to third conditions are satisfied, the plate is synchronously scanned with the mask at a speed corresponding to the imaging magnification ratio, and a two-dimensional enlarged image is clearly transferred with no separations. The plane mirror and the imaging optical system can be moved during manufacturing of the exposure apparatus (initial setting) and during exposure. Since the positions of the plane mirror and the imaging optical systems may shift while the substrate is being exposed, a shift of the optical-axis shift vector can be corrected by moving the plane mirror and the imaging optical system after the exposure of the substrate ends before the next substrate is exposed.

Figure 4:
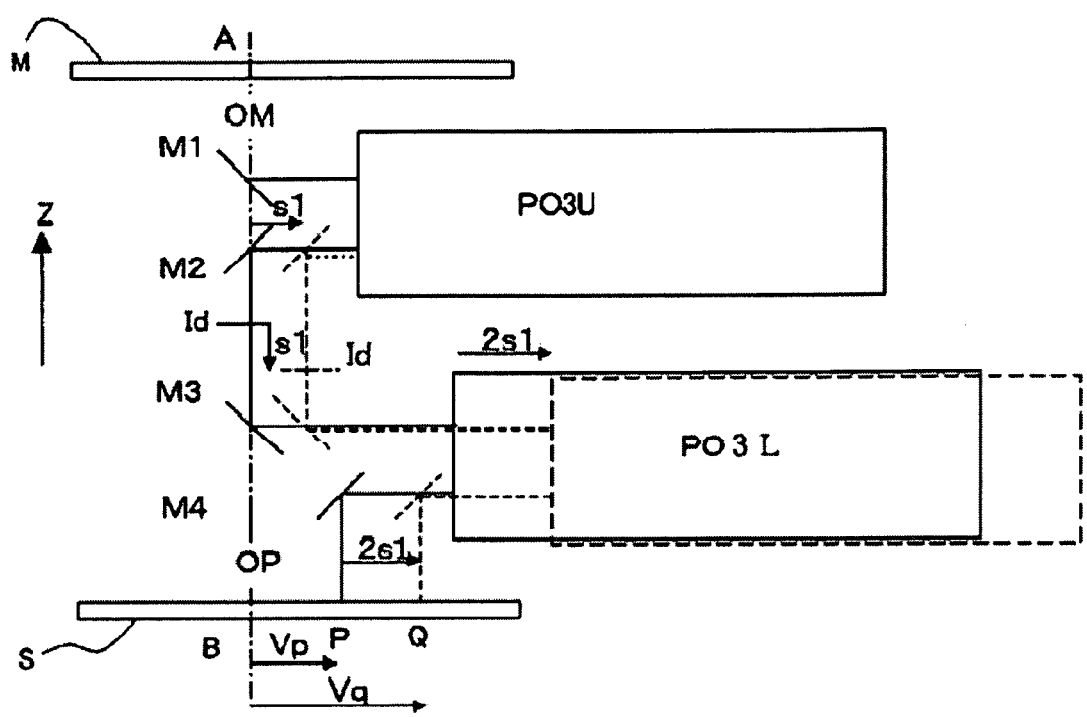
FIG. 4 is a block diagram of an example of an exposure apparatus corresponding to FIG. 1B.

FIG. 4 is a block diagram of the exposure apparatus corresponding to FIG. 1B, and omits the illumination apparatus (i.e., the light source and the illumination optical system). In FIG. 4, each projection optical system includes a first imaging optical system PO3U and a second imaging optical system PO3L. As the number of imaging optical systems increases or the imaging optical system separates farther from the scanning center axis, the size of the optical-axis shift vector increases. A plurality of imaging optical systems can be optically connected to each other by a relay system. This suggests that the substantial optical arrangement is different even when the apparent optical lengths are summed up. On the other hand, the aberration characteristic of the projection optical system for a large panel tends to vary during running due to continuous exposures from the illumination optical system. For the imaging optical systems having the same design values, the interior of each screen and a joint part between adjacent screens can be relatively smoothly corrected by uniformly correcting the aberration, such as changes of astigmatism and distortion. However, the generation manner of the aberration is different between the imaging optical systems having different design values, such as optical power arrangements, and the correction may become extremely difficult. As a result, defective panels may occur with stripe-shaped non-uniformity at the joint part between the divided screens in the scanning direction. In the exposure apparatus shown in FIG. 1B, a plurality of projection optical systems have the same optical length and the same optical characteristic of each imaging optical system, such as design values of the imaging magnification, the aberration, and the transmittance, and the joint part between adjacent screens can be relatively smoothly corrected by uniformly correcting the aberration.

In FIG. 4, the optical axis OM on the mask side intersects with the mask surface at A point. A luminous flux emitted from the A point is deflected in the horizontal direction by a plane mirror M1, and incident upon the first imaging optical system PO3U. A structure of the first imaging optical system PO3U is not limited, and its imaging magnification may be an equal magnification, an enlargement magnification, and a reduction magnification. The luminous flux emitted from the first imaging optical system PO3U is deflected vertically down by the plane mirror M2, and once forms an intermediate image Id. The intermediate image Id enables an erect image of the mask pattern to be projected on the substrate. At this time, the vertical line may accord with the optical axis OM. Thereafter, it is again deflected in the horizontal direction by the plane mirror M3, and incident upon the second imaging optical system PO3L. Although the imaging magnification of the second imaging optical system PO3L may be an equal magnification, an enlargement magnification, or a reduction magnification, but the enlargement imaging magnification is finally maintained when the exit luminous flux is deflected vertically down by the plane mirror M4 and forms an image on the plate S. Such double imaging enables a plurality of divided erect images to be jointed on the plate surface, and the mask pattern to be transferred as one integral enlarged image. In this case, in general, the point P at which the optical axis OP on the plate side intersects with the plate S shifts from the point B at which the optical axis OM intersects with the plate S. The deflection mirrors or the plane mirrors M1 and M4 generate an optical-axis shift vector Vp that has as a start point the point B at which the optical axis OM on the mask side intersects with the plate S, and has as an end point the point P at which the optical axis OP on the plate side intersects with the plate.

The exposure apparatus 10 shown in FIG. 1A may also be applied.

In order to change the sizes of the optical-shift vectors V4 and V5 shown in FIG. 2, M2 and M3 in FIG. 4 are moved in the horizontal directions by s1 and the second imaging optical system PO3L is moved in the horizontal direction by 2S1 to correct the resultant optical length difference. When the imaging point P is moved by 2S1 to an imaging point Q on the plate surface, an amount change is provided to the optical-axis shift vector from Vp to Vq without substantially changing the overall optical path length and while the focal plane is accorded with the plate surface. Thereby, the aberration can be easily corrected without substantially changing the optical design value. A plurality of imaging optical systems ideally have the same optical characteristic or design value but this may not be essential.

Figure 7:
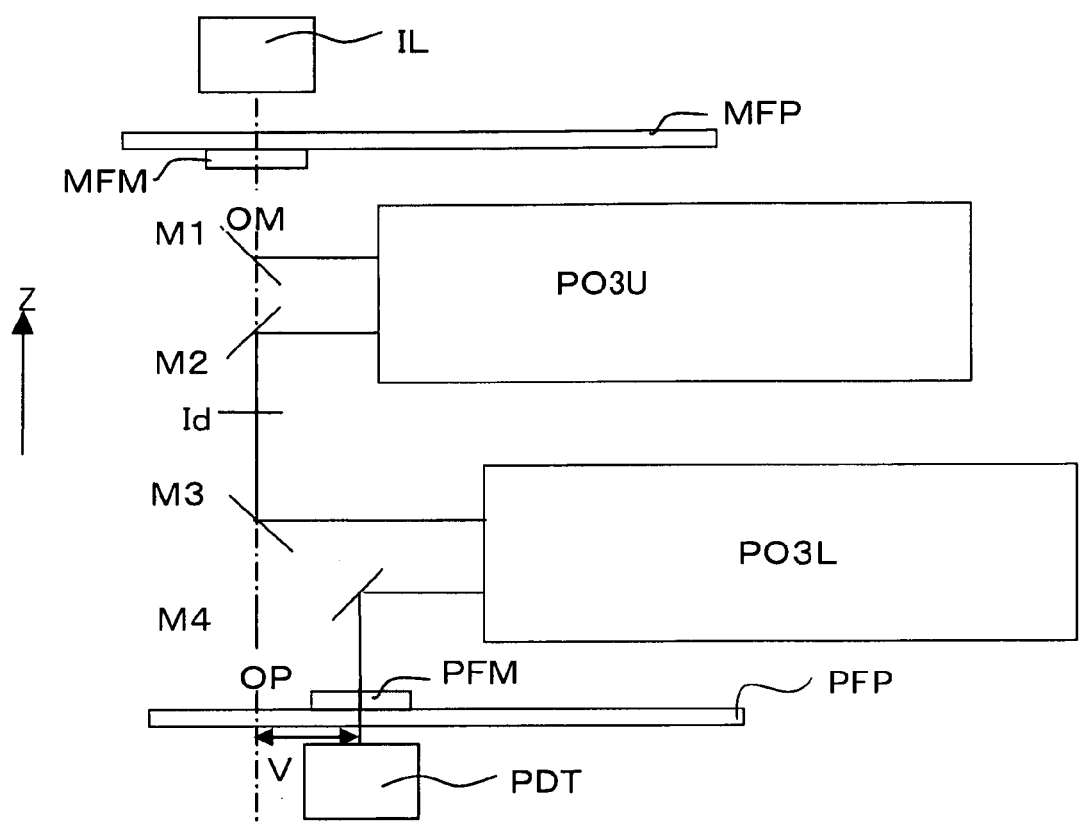
FIG. 7 is a block diagram of an example of an optical system for detecting a shift from a design value of an optical-axis shift vector V in each projection optical system shown in FIG. 4.

FIG. 7 shows an example of an optical system configured to detect a shift of the optical-axis shift vector V from a design value in each projection optical system in the embodiment shown in FIG. 4. In FIG. 7, IL denotes an illumination unit, MFP denotes a mask reference plate, MFM denotes a mask reference mark, PFP denotes a substrate reference plate, PFM denotes a substrate reference mark, and PDT denotes a photo detector.

The illumination unit IL illuminates the mask reference mark MFM, and may use an illumination apparatus used to expose the substrate, or a dedicated illumination apparatus exclusively used to illuminate the mask reference mark MFM. The illumination luminous flux emitted from the illumination unit IL illuminates the mask reference mark MFM arranged on the mark reference plate MFP. The mask reference plate MFP is arranged on part of a mask stage (not shown) of the exposure apparatus, and the mask reference mark MFM is arranged on a focal plane equivalent to the pattern of the mask M. The luminous flux that has transmitted the mask reference mark MFM transmits through the projection optical system (PO3U, PO3L), similar to the diffracted light of the mask pattern in the exposure of the substrate, and again forms an image on the substrate reference plate PFP arranged on part of a substrate stage (not shown). The substrate reference mark PFM is arranged on the focal plane of the substrate reference plate PFP, and the luminous flux that has transmitted through the substrate reference mark PFM is detected by the photo detector PDT. Since a positional relationship between the mask reference mark MFM and the substrate reference mark PFM is predetermined, a shift of the optical-axis shift vector V from the design value can be calculated when the photo detector PDT detects a luminous flux corresponding to the optical-axis shift vector V.

Shifts of the optical-axis shift vectors V can be simultaneously calculated by providing a plurality of mask reference marks corresponding to the projection optical systems to the mask reference plate, and by providing a plurality of substrate reference marks corresponding to the projection optical systems to the substrate reference plate. In this case, the positions of a pair of the mask reference mark and the substrate reference mark corresponding to each projection optical system are adjusted so that they are arranged in the screen of each projection optical system.

In addition, a shift of the optical-axis shift vector from the design value can be calculated by using a single pair of the mask reference mark and the substrate reference mark, by precisely moving the mask stage and the substrate stage, and by feeding a pair of marks into each screen of a plurality of projection optical systems.

While the above detection method detects transmission light quantities of a pair of marks MFM and PFM, a detection method of the present invention for detecting a shift of an optical-axis shift vector from the design value in each projection optical system is not limited this embodiment. A detection method of the present invention includes, for example, a position alignment method between a mask and a plate, such as an image detection method using a two-dimensional CCD.

Figure 5:
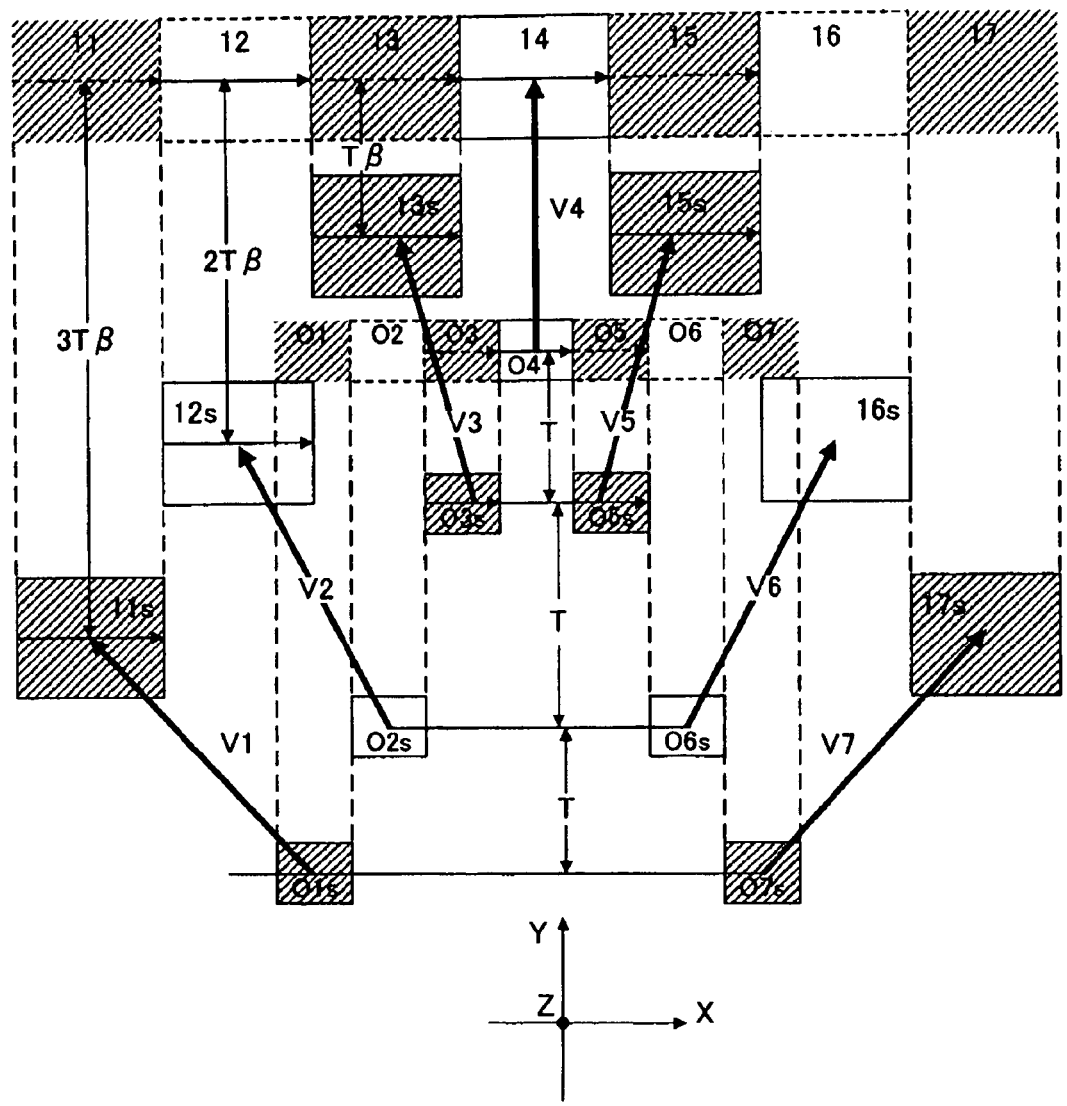
FIG. 5 is a plane view of an example of a variation of FIG. 2.

FIG. 5 is an example of a variation of FIG. 2, and a plane view showing a relationship between a plurality of areas on the original and the transfer areas on the substrate. While the central projection optical system for the screen O3 does not generate an optical-axis shift vector in FIG. 2, FIG. 5 generates a central optical-axis shift vector V4 for the screen O4. FIG. 5 is a schematic plane view of an example of an optical arrangement of the mask viewed from the top in enlarging and projecting seven divided areas of the patterned area on the mask. In FIG. 5, O1 to O7 denote divided screens on the mask, and I1 to I7 denote divided screens on the plate. Similar to FIG. 2, the enlargement magnification β is not particularly limited.

It is understood from FIG. 5 that the screens O1 to O7 on the mask may not be capable of being directly transferred on the screens I1 to I7 on the plate in order to avoid the physical interference among the plurality of projection optical systems. In other words, it is understood that when a circumscribed circle that indicates a diameter of the projection optical system is drawn for each rectangular area, the circumscribed circles may interfere with each other. This embodiment shifts each projection optical system in the scanning direction or the Y direction so as to solve this problem. More specifically, in FIG. 5, a first projection optical system is provided so as to forms an image of the area (screen) O1s on the mask onto I1s on the plate, and the optical-axis shift vector is labeled as V1. Similarly, a second projection optical system configured to image a screen O2s onto a screen I2s is provided, and the optical-axis shift vector is labeled as V2. Subsequently, third to seventh projection optical systems are provided in similar manner.

This embodiment may also satisfy the three conditions to joint enlarged images. Firstly, adjacent areas among the screens O1s to O7s on the mask, such as the screens O1s and O2s, are arranged so that they shift by a predetermined amount in the scanning direction but adjoin each other when viewed from the direction orthogonal to the scanning direction (first condition). Secondly, adjacent areas among the screens I1s to I7s on the plate, such as the screens I1s and I2s, are arranged so that they shift by a predetermined amount in the scanning direction but adjoin each other when viewed from the direction orthogonal to the scanning direction (second condition). Thirdly, in FIG. 5, for example, a distance between the screens O3s and O3 in the scanning direction is T, and a corresponding distance between the screens I3s and I3 on the plate in the scanning direction is β·T, where β is an optical enlargement or reduction magnification from the mask to the plate (third condition).

By satisfying the above three conditions, each projection optical system can transfer each mask pattern area onto a correct coordinate position in the scanning direction (of course also the coordinate position in the direction orthogonal to the scanning direction) although the exposure time may deviate. As a result, when the exposure of the plate ends, the screens O1 to O7 on the mask can be transferred onto the screens I1 to I7 on the plate, and the integrated enlarged image can be obtained.

Each projection optical system does not necessarily need to have the same screen size in this embodiment, and the conditions of this embodiment may be met even with different screen sizes. More specifically, assume that there are odd (=2n+1) projection optical systems and their screen sizes are 2·Yi (i=0~n) from the scanning center axis. Then, the component of the optical-axis shift vector of the n-th projection optical system in the direction orthogonal to the scanning direction from the 0-th projection optical system that is located on the scanning center axis may have a size of (β−1)·(Y0+Yn+Σ2·Yi) (i=1~n−1), where β is an imaging magnification of each projection optical system.

Figure 6:
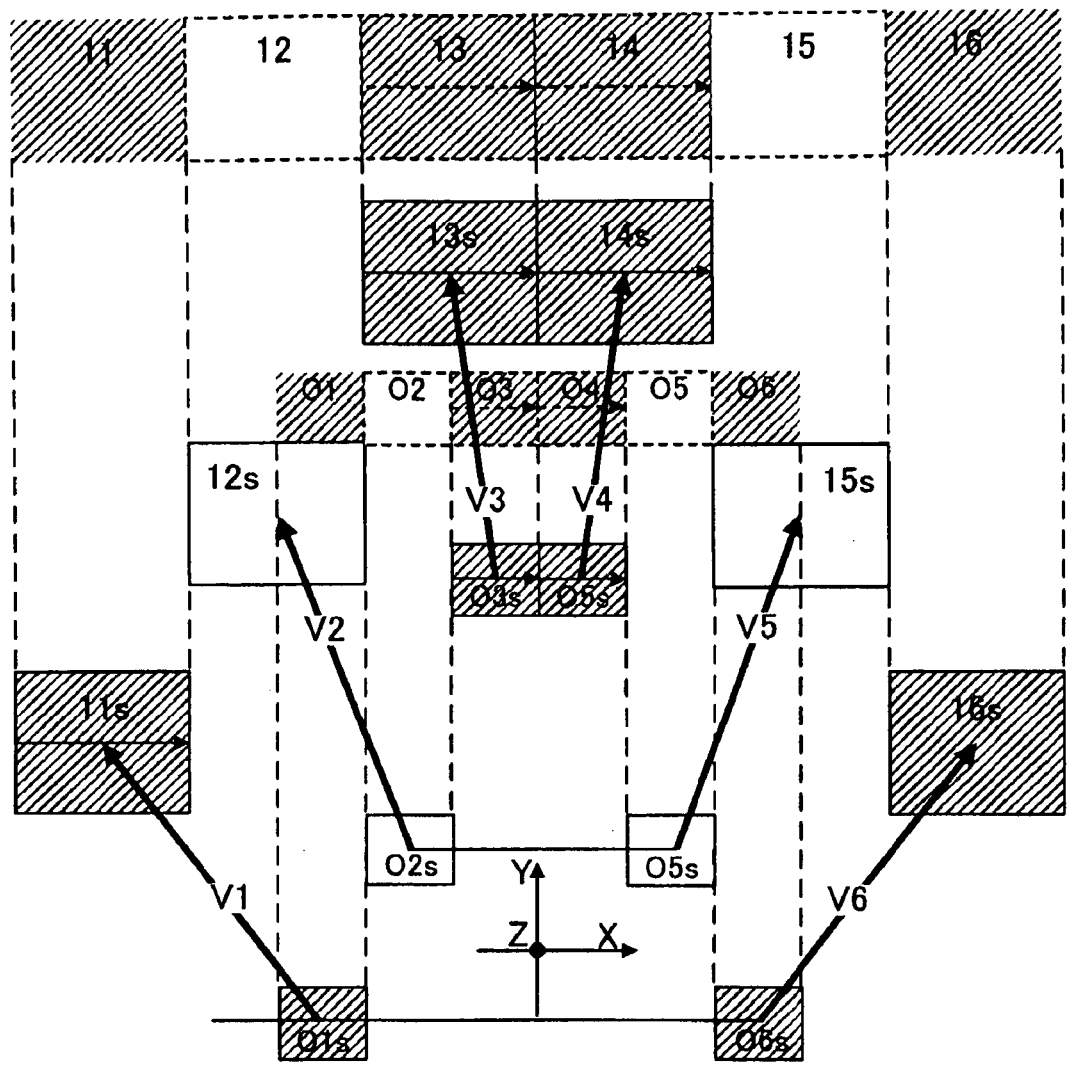
FIG. 6 is a plane view showing an example of a relationship between a plurality of areas (screens) on a mask (original) and a plurality of transfer areas of a plate (substrate).

FIG. 6 is a plane view showing an example of a relationship between a plurality of areas on the original and the transfer areas on the substrate. FIG. 5 arranges seven (odd) projection optical systems, whereas FIG. 6 arranges six (even) projection optical systems and another arrangement and the conditions to be satisfied are similar to those of FIG. 5. When even (=2n) projection optical systems are provided and arranged symmetrical with respect to the scanning center axis as in this embodiment, a shift amount of an image surface center of an n-th projection optical system is given by (2n−1)·Y(β−1).

Each projection optical system does not necessarily need to have the same screen size in this embodiment, and the condition of this embodiment may be met even with different screen sizes. More specifically, assume that there are even (=2n) projection optical systems and their screen sizes are 2·Yi (i=1~n) from the scanning center axis. Then, the component of the optical-axis shift vector of the n-th projection optical system in the direction orthogonal to the scanning direction from the scanning center axis may have a size of (β−1)·(Yn+Σ2·Yi) (i=1~n−1), where β is an imaging magnification of each projection optical system.

While this embodiment arranges a plurality of projection optical systems symmetrical with respect to the scanning center axis (or the Y axis), a plurality of projection optical systems may also be arranged asymmetrical with respect to the Y axis (not shown). In this case, the projection optical system that has a component of the optical-axis shift vector 0 in the direction orthogonal to the scanning direction is set to a base point optical system among the plurality of projection optical systems. Then, in the k-th projection optical system from the base point optical system as a base point in the direction orthogonal to the scanning direction, the component of the optical-axis shift vector in the direction orthogonal to the scanning direction may have a size $(\beta-1)\cdot(Y0+Yk+\Sigma 2\cdot Yi)$ $(i=1\sim k-1)$, where $\beta$ is an imaging magnification of each projection optical system, and Yi $(i=1\sim k-1)$ is half a length of the mask screen in the direction orthogonal to the scanning direction.

Thus, this embodiment arranges a plurality of small projection optical systems and can expose a large screen through simultaneous enlargements and precise joints. Since a relatively large panel is exposed with an enlargement system and a relatively small original, the cost can be reduced. As a result, the productivity of the liquid crystal panel may improve without a substantial cost increase, contributing to the distributions to the market.

While these embodiments discuss the projection optical system having an enlargement magnification, the above embodiments may also be applicable to a reduction system by inverting the mask surface (object surface) and the plate surface (image surface).

Aspects according to embodiments of the present invention may provide an exposure apparatus that can inhibit and/or prevent physical interference of the projection optical systems and that maintains connections of the screens both on the original and on the substrate.

A device, such as a semiconductor integrated circuit device and a liquid crystal display device, may be manufactured by the step of exposing a substrate, such as a wafer and a glass plate, on which a photosensitive agent is applied by using the exposure apparatus according to one of the above embodiments, the step of developing the substrate, and another step. Thus, a device manufacturing method that uses the above exposure apparatus may also constitute one aspect of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications Nos. 2008-035040, filed on Feb. 15, 2008, and 2008-320382, filed on Dec. 17, 2008, which are hereby incorporated by reference herein in their entirety.

What is claimed is:

1. An exposure apparatus configured to expose a plurality of areas on an original onto a substrate by synchronously scanning the original and the substrate, the exposure apparatus comprising a plurality of projection optical systems each having an imaging magnification of an equal enlargement or reduction, and each projection optical system forming an intermediate image of the pattern of the original and projecting an erect image of the pattern of the original onto the substrate, wherein each projection optical system includes:
a plurality of mirrors configured to form an optical-axis shift vector that has a start point that is a point on the substrate at which an optical axis of the projection optical system on an original side intersects with the substrate, and an end point that is a point on the substrate at which an optical axis of the projection optical system on a substrate side intersects with the substrate; and
a movement unit configured to move the plurality of mirrors so that the optical-axis shift vector has a component in a direction orthogonal to a scanning direction which enables adjacent areas in the plurality of areas on the original to adjoin each other in the direction orthogonal to the scanning direction and enables adjacent areas in the plurality of areas on the substrate to adjoin each other in the direction orthogonal to the scanning direction, and configured to move the plurality of mirrors so that the optical-axis shift vector has a component in a scanning direction which enables a product between the imaging magnification of each projection optical system and a distance between centers of two areas on the original in the scanning direction corresponding to two adjacent projection optical systems in the plurality of projection optical systems to be equal to a distance between centers of two areas on the substrate in the scanning direction corresponding to the two adjacent projection optical systems, wherein a first projection optical system among the plurality of projection optical systems includes an imaging optical system having an optical axis orthogonal to the optical axis on the original side and the optical axis on the substrate side, and wherein in the first projection optical system the optical-axis shift vector is changed without changing an optical path length of the first projection optical system by moving the imaging optical system and at least one of the plurality of mirrors in a direction of the optical axis of the imaging optical system.

2. The exposure apparatus according to claim 1, wherein there are 2n+1 projection optical systems where n is a natural number, and each projection optical system has an equal screen size, and wherein where $\beta$ is the imaging magnification of each projection optical system, and Y is half a length of each area on the original in the direction orthogonal to the scanning direction, a component of an optical-axis shift vector of an n-th projection optical system from a central projection optical system among the plurality of projection optical systems has a size of $2n\cdot Y(\beta-1)$ in the direction orthogonal to the scanning direction.

3. The exposure apparatus according to claim 1, wherein there are 2n projection optical systems where n is a natural number, and each projection optical system has an equal screen size, and wherein where $\beta$ is the imaging magnification of each projection optical system, and Y is half a length of each area on the original in the direction orthogonal to the scanning direction, a component of an optical-axis shift vector of an n-th projection optical system from a scanning center axis that passes a center of the plurality of projection optical systems has a size of $(2n-1)\cdot Y(\beta-1)$ in the direction orthogonal to the scanning direction.

4. The exposure apparatus according to claim 1, wherein there are 2n+1 projection optical systems where n is a natural number, and wherein an n-th projection optical system from a central projection optical system among the plurality of projection optical systems has a screen size of $2\cdot Yi(i=0\sim n)$ in the direction orthogonal to the scanning direction, and an optical-axis shift vector that has a component with a size of $(\beta-1)\cdot(Y0+Yn+\Sigma 2\cdot Yi)(i=1\sim n-1)$ in the direction orthogonal to the scanning direction, where $\beta$ is the imaging magnification of each projection optical system, and Yi is half a length of each area on the original in the direction orthogonal to the scanning direction.

5. The exposure apparatus according to claim 1, wherein there are 2n projection optical systems where n is a natural number, and wherein an n-th projection optical system from a scanning center axis that passes a center of the plurality of projection optical systems has a screen size of $2\cdot Yi(i=1\sim n)$ in the direction orthogonal to the scanning direction, and an optical-axis shift vector that has a component with a size of $(\beta-1)\cdot(Yn+\Sigma 2\cdot Yi)(i=1\sim n-1)$ in the direction orthogonal to the scanning direction, where $\beta$ is the imaging magnification of each projection optical system, and Yi is half a length of each area on the original in the direction orthogonal to the scanning direction.

6. The exposure apparatus according to claim 1, wherein where $\beta$ is the imaging magnification of each projection optical system, and Yi ($i=1\sim k-1$) is half a length of each area on the original in the direction orthogonal to the scanning direction, the plurality of projection optical systems have a projection optical system that serves as a base point and has an optical-axis shift vector with a component of 0 in the direction orthogonal to the scanning direction, and a k-th projection optical system from the projection optical system as the base point has an optical-axis shift vector with a component of $(\beta-1)\cdot(Y0+Yk+\Sigma 2\cdot Yi)$ in the direction orthogonal to the scanning direction.

7. The exposure apparatus according to claim 1, wherein each projection optical system includes a plurality of imaging optical systems,
wherein the plurality of mirrors include a plurality of mirrors arranged between adjacent imaging optical systems, and
wherein the movement unit moves the plurality of mirrors arranged between adjacent imaging optical systems in a direction perpendicular to the optical axis of the projection optical system on the substrate side.

8. The exposure apparatus according to claim 1, wherein each projection optical system includes a plurality of imaging optical systems, and a unit configured to move at least one of the plurality of imaging optical systems along the optical axis of the imaging optical system.

9. The exposure apparatus according to claim 1, wherein each projection optical system includes a plurality of imaging optical systems, and
wherein each imaging optical system has the same relative position in the plurality of projection optical systems, and the plurality of mirrors have different relative positions.

10. A device manufacturing method comprising:
exposing a substrate by using an exposure apparatus according to claim 1; and
developing the substrate that has been exposed.

11. The exposure apparatus according to claim 1, further comprising a detector configured to obtain information that represents the optical-axis shift vector.

12. The exposure apparatus according to claim 11, wherein the movement unit sets positions of the plurality of mirrors based on the information that is obtained by the detector.

13. The exposure apparatus according to claim 1, wherein each projection optical system includes a first imaging optical system configured to form an intermediate image and a second imaging optical system configured to form an image of the intermediate image, and
wherein the second imaging optical system is movable in an optical axis direction.

14. The exposure apparatus according to claim 1, wherein the plurality of mirrors include a first mirror configured to introduce light into the second imaging optical system and a second mirror configured to introduce the light from the second imaging optical system to the substrate,
wherein the first mirror and the second mirror are located in a different position in an optical axis direction of the second imaging optical system.

* * * * *